United States Patent [19]

Gilbert

[11] 3,879,229

[45] Apr. 22, 1975

[54] TUBULAR THERMOPILE

[76] Inventor: William W. Gilbert, 372 S. Williamsbury, Birmingham, Mich. 48010

[22] Filed: Apr. 19, 1972

[21] Appl. No.: 245,346

[52] U.S. Cl. ................ 136/208; 136/202; 136/204; 136/225; 136/224; 62/3

[51] Int. Cl. ................................................ H01r 1/02

[58] Field of Search ........... 136/208, 207, 209, 210, 136/224, 225, 204; 29/576; 62/3

[56] References Cited

UNITED STATES PATENTS

| | | | |
|---|---|---|---|
| 398,272 | 2/1889 | Mestern | 62/3 X |
| 1,873,421 | 8/1932 | Kanter | 136/207 X |
| 3,097,027 | 7/1963 | Mims et al. | 62/3 X |
| 3,183,121 | 5/1965 | Moeller | 62/3 X |
| 3,392,061 | 7/1968 | Scheiner et al. | 136/211 X |
| 3,434,203 | 3/1969 | Thorp | 29/573 |

*Primary Examiner*—Benjamin R. Padgett
*Assistant Examiner*—E. A. Miller

[57] ABSTRACT

A tubular thermoelectric generator with a cylindrical wall of alternate P and N type thermoelectric material strips of wedge-shaped cross-section positioned longitudinal the cylinder and locked in a full-circular arch by external banding in a continuous assembly process.

9 Claims, 9 Drawing Figures

TUBULAR THERMOPILE

The present invention relates to electric generators of the thermoelectric type for "direct" conversion of heat into electricity and which operate on the Seebeck principle. More specifically, this invention relates to new and improved configurations of the thermoelectric elements assembled into thermopiles by a new and improved method and for subsequent embodiment into thermoelectric generating and Peltier principle devices.

Those skilled in the art are aware that, having selected thermoelectric materials of given inherent properties for construction, a thermopile for the production of electric power should have the following desirable features and characteristics:

A large number of junctions displayed at the heat receiving and heat rejecting surfaces of the pile per unit of pile length, to multiply the voltage generated per thermocouple in the pile to a conveniently usable level.

A large area of junctions displayed at the heated and cooled surfaces, per unit of pile surface, to maximize the power generated per unit area of the thermopile.

A high electrical cross-section, to keep the electrical resistance and corresponding Joule loss, $I^2R$, low.

A relatively high specific power characteristic, that is a high power production per unit of weight.

Reliable electrical contact at the P and N (dissimilar) material junctions, under all conditions, to obviate interruption of the electrical series.

Good heat transfer to the hot junctions of the pile, to maximize the temperature of these junctions.

Structural members maintaining the physical shape of the pile and the junction contacts shielded from the heat source, to assure good structural life of these members.

Heat receiving surfaces capable of accepting heat from a high temperature source. Generated voltage, power output and efficiency of these devices is inherently a function of temperature.

Capability of being produced simply and rapidly at relatively low cost per unit of thermopile power output, plus convenience and simplicity of embodiment into working thermoelectric generators and Peltier devices.

A thermopile should also, for certain applications, incorporate means to pass a modifying electric current through the pile to modify by electrical inductance the amount and characteristics of the electric power produced by the thermopile.

In the past there have been many thermopiles constructed to convert heat to electricity but these prior art devices have been deficient in one or more of the foregoing features and characteristics, resulting in generators which are either low in specific power, unsuited to high temperature heat sources, electrically unreliable at the junctions of the thermoelectric materials, somewhat impractical for general application, or requiring tedious and expensive methods to manufacture.

The present invention has for an object to provide a thermopile which incorporates the desirable features and characteristics hereinbefore listed and which, when constructed of any given thermoelectric materials, is high in specific power, suitable for high temperature heat sources, reliable in service, practical to embody in wide variety of Seebeck and Peltier thermoelectric applications and one which can be simply and rapidly produced at relatively low cost per unit of power output.

Another object of the present invention is to provide a thermopile for the production of electric power which incorporates means to pass a modifying electric current through it, in order to modify, by inducing an electric current in the elements of the thermopile, the amount and characteristics of the electric power produced.

These and other objects and advantages of the present invention will best be understood from the following description when read in conjunction with the accompanying drawings in which.

Figure 3:
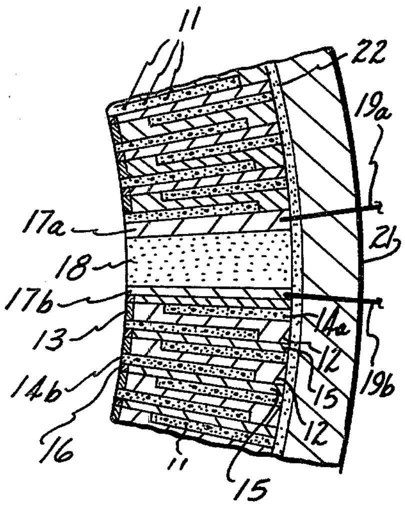
FIG. 3 is a sectional view of the cylinder wall of FIG. 1 enlarged to show in more detail the arrangement and construction of the thermoelectric elements of this invention.

Referring to FIG. 3, there is shown a thin strip 12 of "P" type conductivity thermoelectric material of cross-section much resembling a structural zee, flattened at the flanges such that the strip at its flanges is approximately twice the thickness at its web. One flange is flattened slightly more than the other. The dimensions of strip 12 may be any proportionate values, but for the purposes of this explanation, and not by way of limitation, typical values of: web thickness .005 inch; outer flange thickness (shown at the right edge of strip) .010 inch; inner flange thickness (shown at the left edge of strip) .008 inch; and width of strip .250 inch are selected. Length of the strip is as desired, since it is fabricated continuously and cut to length as required or as dictated by handling limitations.

A protective wire edge 13, approximately .008 inch × .005 inch, rectangular in cross-section, of high temperature heat conductive material such as chrome steel is bonded to the inner (as shown on the left) edge of strip 12, with the .008 inch dimension of 13 adjacent the .008 inch edge of strip 12.

Coatings 14*a* and 14*b* approximately .005 inch thick of high temperature electrical insulating material such as magnesium silicate, alumina, magnesium oxide or the like are bonded to strip 12 in the position shown FIG. 3 to coat both sides of the web, but not the flanges, of the zee-shaped P element 12. These coatings 14*a* and 14*b* may be applied directly to the web of 12 in plain form or they may be prefabricated with a plurality of fine reinforcing wires 11, shown FIG. 3, imbedded in them, after which they are bonded to the web of stip 12. Reinforcing wires 11 may be of good electrical conductivity material and for a purpose to be described hereinafter. Wires 11 completely lie imbedded in coatings 14*a* and 14*b* parallel to strip 12 and parallel one another, spaced apart as shown FIG. 3.

The edge and coated zee-strip 12 is then precision-ground to the arch-like or wedge-shaped cross-section shown, .015 inch thick at the outer edge, .013 inch thick at the inner edge and .255 inch wide. It is then stored in manageable lengths for later assembly as shall be described hereinafter. One way to store the product, which resembles a thin flat wire of slightly wedge-shape cross-section, is in reels of sufficient core diameter to avoid cracking the coatings.

Shown FIG. 3 is a thin strip 15 of "N" type thermoelectric material also of wedge-shaped cross-section .005 inch thick at the outer edge and .0044 inch thick at the inner edge and .250 inch wide. Again, these dimensions may be any proportionate values and those selected are for the purpose of this explanation, and not by way of limitation. This "N" strip 15 is not coated with insulation.

A protective wire edge 16 of rectangular cross-section about .005 inch × .0044 inch of high temperature material such as chrome steel is bonded to the inner edge, shown on the left, of strip 15. The edged strip is then precision-ground to a wedge-like cross-section .005 inch × .0044 inch × .255 inch wide and stored also in manageable lengths.

It should be noted here that the coated zee elements may be made of "N" type conductivity thermoelectric material and the uncoated elements of "P" type material, if desired, so long as the materials are dissimilar, as is required of any thermocouple. Also, although not shown on the drawings, it is obvious that both elements may be similar in cross-section, i.e. L-shaped, with each having one flange only and each coated on the inside of its web, thus by precision grinding one type element with a taper toward its flange and the opposite type element with a taper away from its flange and turning it upside down in the assembly the elements may be assembled (alternate "P" and "N" elements) into the same electrical arrangement in the wall of the tube as described and shown for the basic coated zee "P" elements and uncoated "N" elements above.

It should also be noted that one or both of the element strips of wedge-shaped cross-section of this invention may be made of two or more types of thermoelectric strips lying parallel and abutting at their edges and assembled into a cascaded thermopile.

Two wedge-shaped terminal strips 17*a* and 17*b* about .010 inch × .008 inch × .255 inch wide of good electrical conductivity and high temperature properties are bonded in the position shown FIG. 3 to a wedge-shaped high temperature insulation strip 18 which is about .200 inch × .198 inch × .255 inch wide in cross-section. Strip 18 separates 17*a* and 17*b* terminal strips physically and electrically. This wedge-shaped sandwich strip assembly is stored also for assembly into the tubular thermopile later. Terminal strips 17*a* and 17*b* are not mandatory (electrically) in the assembly as the connections 19*a* and 19*b* shown FIGS. 1, 2, 3 and 4 can be made directly to the terminal "P" and "N" elements in the assembly. However, they simplify the connections and act as reinforcement for the insulator wedge 18 during assembly.

The exact finish dimensions of all the arch or wedge-shaped cross-section strips is such that when they are assembled into a cylindrical array and become the wall of a thermoelectric tube the plane of the surface of each strip lies radially in the completed cylinder and each strip is positioned as a longitudinal element of the cylindrical tubular thermopile of circular cross-section.

Figure 1:
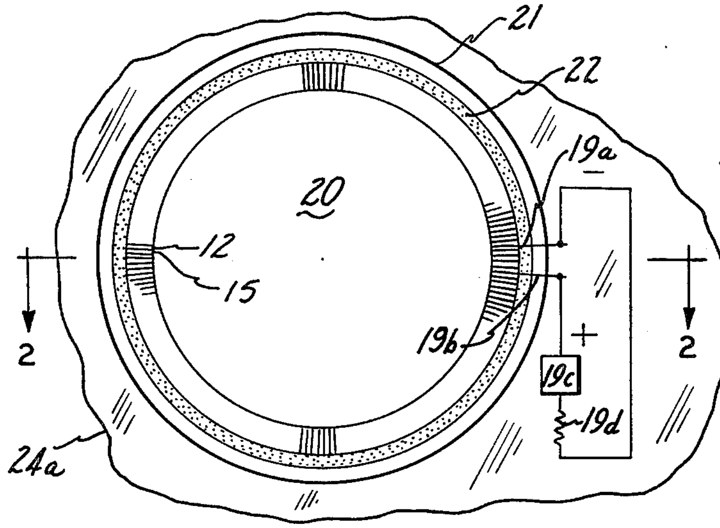
FIG. 1 is a fragmentary semi-schematic end view of a cylindrical tubular thermopile constructed in accordance with the present invention.
Figure 2:
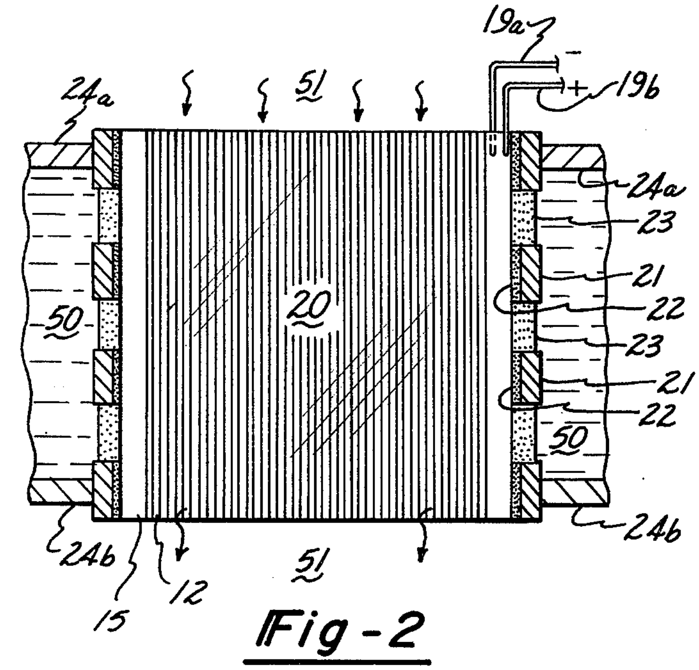
FIG. 2 is a partial sectional view taken at line 2—2 of FIG. 1.

Strips of the various elements described above are now assembled into the cylindrical tube 20 of circular cross-section shown in FIG. 1 and FIG. 2, alternating one "P" strip, next one "N" strip and so on. The approximate dimensions given above for the various strips of material to be assembled into the tube 20 of FIGS. 1 and 2 are suitable for assembly into a tubular thermopile about 3.5 inches I.D. × 4.0 inches O.D. and comprised of approximately 617 coated and edged zee, "P" type elements 12, 617 edged uncoated "N" type elements 15, one each terminal elements 17*a* and 17*b*, and one insulator element 18. If desired, one or more terminal elements 17*a* may be substituted for thermoelectric elements at intervals in the array to improve the strength of the finished tube and without materially affecting the electrical characteristics of the device.

Figure 4:
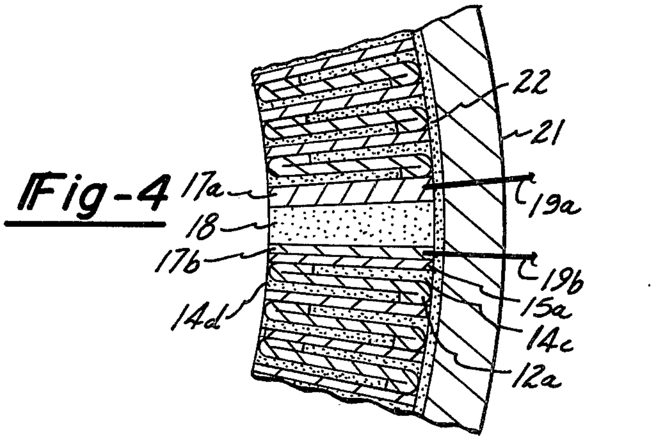
FIG. 4 is an enlarged sectional view of an alternate cylinder wall construction to that shown in FIG. 3.
Figure 5:
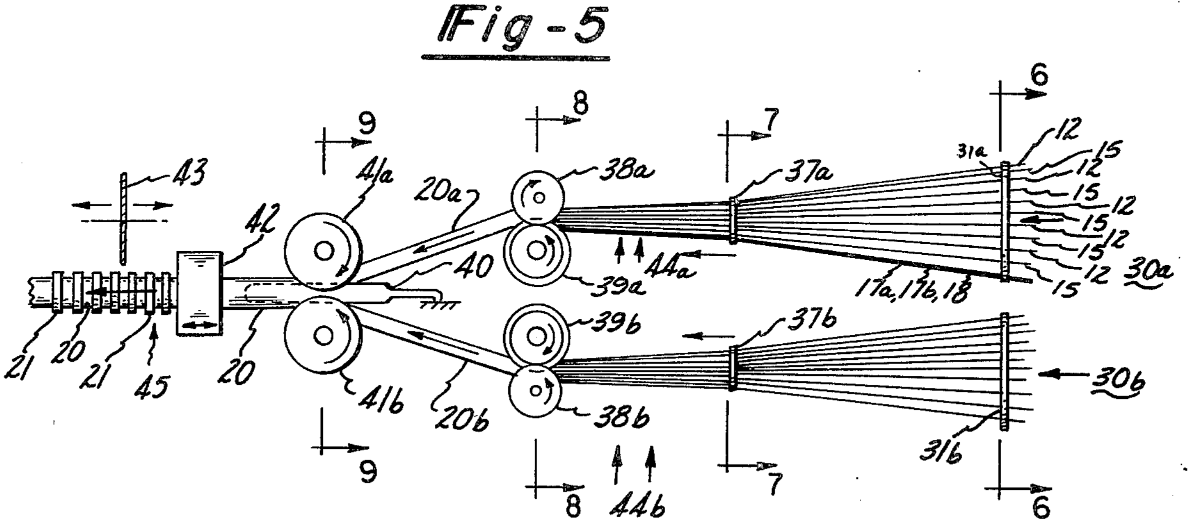
FIG. 5 is a schematic drawing of the assembly method of this invention for the tubular thermopile of this invention.
Figure 6:
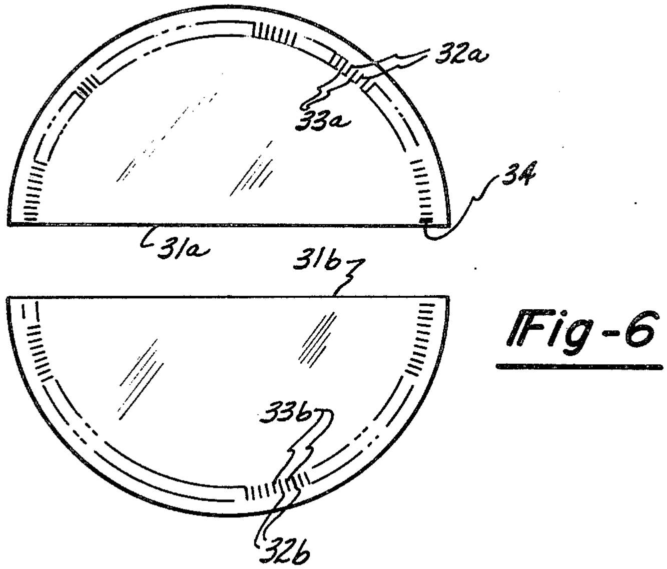
FIG. 6 is an enlarged view taken at line 6—6 of FIG. 5.

The elements are assembled into the tubing generally designated 20 continuously, as shown schematically in FIG. 5, the finished tubing being cut to length after assembly, as desired, by travelling cut-off saw 43. Electrical leads 19*a* and 19*b* shown FIGS. 1, 2, 3 and 4 are affixed to the terminal strips 17*a* and 17*b* respectively after the tube has been cut to length.

Referring now to FIGS. 5, 6, 7, 8 and 9, assembly of a typical tube, 4 inch O.D. in this example, is as follows:

From the element stock area generally designated 30*a* upper part of FIG. 5, a plurality of strips or strands of coated-zee "P" type elements 12, 303 strands in the example used in this explanation, is fed through guide slots 32*a* in guide plate 31*a*. A plurality, 303 in this example, of uncoated "N" type elements 15 from the storage area 30*a* is fed through guide slots 33*a* in guide plate 31*a*. Slots 33*a* and 33*b* are respectively of the precision-ground finish cross-sectional dimensions of elements 12 and 15 with allowable tolerance for passage and are cut radially in guide plate 31*a* near its periphery in a semicircular array as shown FIG. 6, alternating one 32*a* slot, next one 33*a* slot and so on. At the one end of the semi-circular array, guide slot 34 accomodates the terminal sandwich of element 17*a*, the insulator element 18 and the terminal element 17*b*, which also comes from the storage area 30*a*.

Figure 7:
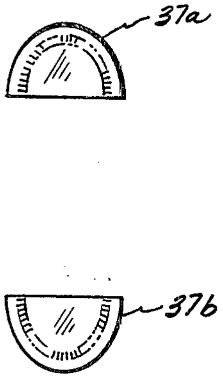
FIG. 7 is an enlarged view taken at line 7—7 of FIG. 5.

The pluralities of elements then pass through successively converging guide slot arrays, representative of which is the semielliptical array shown FIG. 7 in guide plate 37*a*. The minor axis of this array is the diameter of the finished tubing 20 and the major axis is great enough to permit machining the necessary 304 guide slots in plate 37*a*.

Figure 8:
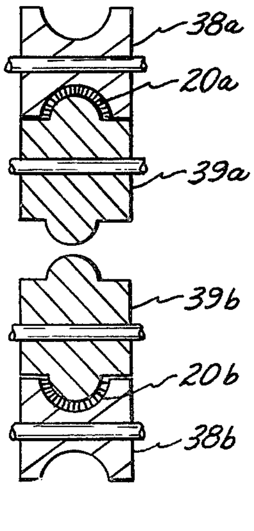
FIG. 8 is an enlarged view taken at line 8—8 of FIG. 5.

The pluralities of alternate "P" and "N" elements and terminal sandwich element next enter the mating drive rolls 38*a* and 39*a* whose peripheral contours exactly accommodate at the tangent point of these two rolls as shown FIG. 8 the now half-cylinder of assembled alternate "P" type elements 12, "N" type elements 15, terminal strips 17*a* and 17*b* and the insulator strip 18. The drive rolls 38*a* and 39*a* pull the pluralities of elements from the supply area 30*a* through the converging guide slots so that a continuous half-cylinder of assembled elements 20*a* emerges from drive rolls 38*a* and 39*a*.

banding 21 to maintain the thermoelectric elements 12 and 15 in good electrical contact throughout the length of the tube exposed to said fluid pressure. The coolant fluid 50 may be pressurized and used as a working medium to drive conventional prime movers. The heat in coolant 50 may be used for space or other heating purposes.

A heat source, generally designated 51 in FIG. 2, passes through the inside of tube 20 and heats the hot junctions of the plurality of thermoelectric elements 12 and 15 which lie near the internal periphery of the tube. The heat source 51 may be heated fluids at atmospheric or other pressure or it may be movable heated solids, or a nuclear heat source.

When tubular thermopile 20 is heated internally by heat source 51 and cooled externally to a temperature lower than heat source 51 by coolant 50, a voltage difference appears between electrical connections 19*a* and 19*b* to the terminal elements 17*a* and 17*b*, in accordance with the Seebeck principle. The electrical series of 617 individual "P" and "N" thermocouples starts at terminal element 17*a* and continues around the tube wall to terminal element 17*b* with all of the junctions to be heated lying near the inside periphery of the tube wall and all of the junctions to be cooled lying near the outside periphery of the tube wall. The voltage generated by each thermocouple is multiplied 617 times in the thermopile 20 in this example.

The tubing may, of course, be heated externally and cooled internally with the same basic result. In this case, however, the temperature of the heat source must be sufficiently low to avoid relieving the stress in or damaging bands 21.

When heated internally and cooled externally or vice versa as described above and when electrical connections 19*a* and 19*b* are connected as shown schematically FIG. 1, ordinarily through a typical voltage regulating and cut-out means 19*c*, to any electrical load, representative of which is load 19*d*, an electric current flows through the circuit. Pluralities of tubes may be connected in various electrical series or parallel arrangements or combinations of them as desired.

By connecting the electrically conductive fine wires 11 in electrical series at the ends of the tube after it is cut to length, and passing an electric current through the series an electric current is induced into the alternate "P" and "N" elements in the tube wall and the amount and characteristics of the electric power produced by the tubular thermopile are modified, by the same principle as the Ettingshausen effect produces Peltier effects in thermopiles.

By connecting 19*a* and 19*b* to a suitable D.C. power source means the tube may also be used to pump heat from 50 to 51 or vice versa in accordance with the Peltier effect principle.

In FIG. 2 there is shown fragmentally and schematically an upper tube sheet 24*a* and a lower tube sheet 24*b* each of which may be enlarged to contain a plurality of tube holes each similar to the hole into which tubular thermopile 20 is shown inserted and spaced apart as desired with each hole in upper tube sheet 24*a* having a corresponding hole in a similarly enlarged lower tube sheet 24*b*, so that a plurality of thermoelectric tubes 20 may be inserted at the ends in corresponding upper and lower tube holes. The joints between the bands 20 and these tube holes are sealed. Thus a common source of heating fluid 51 may supply heat to the insides of a plurality of tubes 20 and a common source of cooling fluid 50 may cool the outsides of the plurality of tubes. Electrical connections 19*a* and 19*b* may then be connected in series to those of other tubes to multiply voltage generated in the tubes, or in parallel to multiply current, or with some groups in series and some in parallel to produce electrical characteristics required for the particular application.

Referring now to FIG. 4 there is shown an alternate to the enlarged wall section shown FIG. 3 and differing only in that the thermoelectric elements are made of metals or other thermoelectric materials, one of which is sufficiently ductile to permit bending and rolling its edges into the flattened zee cross-section hereinbefore described for the basic wall structure device of FIG. 3. A continuous flat strip of the ductile material about 0.005 inch thick × 0.375 inch wide is passed through a series of conventional upsetting and forming rolls which fold over (in opposite directions) about 0.0625 inch of each edge until the strip is folded and pressed into the flattened zee 12*a*. Coatings 14*c* and 14*d* are bonded to the web of strip 12*a* in the position shown FIG. 4 to coat the web but not the flange of the zee, same as described hereinbefore for the basic zee section of FIG. 3. The strip is then precision-ground to a wedge or arch shape approximately 0.015 inch thick at the outer edge, 0.013 inch thick at the inner edge × 0.250 inch wide. Again, these dimensions may be any proportionate values which will permit the planes of the surfaces of the finished strip to lie radially in an assembled thermoelectric tube, the values given being selected only for the purpose of this exlanation and not by way of limitation, and, in this case, sutiable for assembly into a tube approximately 3.5 inch I.D.×4.0 inch O.D. The "N" type, uncoated elements 15*a* are precision ground to a wedge-shaped cross-section approximately 0.005 inch × 0.0044 inch × 0.250 inch wide and are essentially identical to the basic "N" strips of FIG. 3.

In the alternate structure shown FIG. 4 the "P" and "N" strips are not edged with high temperature material as is the case for the basic structure of FIG. 3, although obviously they may be edged if desired. In this alternate structure of FIG. 4 the materials may be suitable "P" and "N" metals such as iron and constantan capable of withstanding relatively high temperature and the atmosphere of the heat source without protection.

The remaining steps to assemble and fabricate a tube with the alternate tube wall material and structures of FIG. 4 are identical to those described for the basic tube wall of FIG. 3.

From the foregoing specification drawings and description, it is evident that the objects of this invention are achieved.

A large number of junctions of thermocouples in electrical series is displayed in a relatively small tubular periphery, thus attaining a high multiplication of generated voltage per unit length of perimeter of the thermopile.

Each element in the tubular thermopile extends the entire length of the tubular pile, thus the electrical cross-section, being the area of the thickness of the element multiplied by its entire length, is always increased in proportion to the length of the tube, which, in turn, is proportionate to the amount of power generated.

A second and matching continuous half-cylinder of assembled elements 20*b* is formed similarly to 20*a* and as shown in the lower part of FIG. 5, differing from 20*a* only in that it does not contain terminal elements 17*a* and 17*b* nor insulator element 18 since only one set of these elements is required in the finished tubing. Thus 20*b* is made of assembled alternate "P" type elements 12 and "N" type elements 15 only, 314 each in this example.

Figure 9:
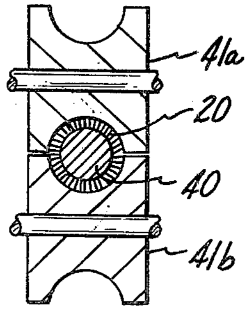
FIG. 9 is an enlarged view taken at line 9—9 of FIG. 5.

The two continuous matching half-cylinders of assemblies 20*a* and 20*b* are then passed to at least one set of mating drive rolls 41*a* and 41*b* whose peripheral contours exactly accommodate at the tangent point of these two rolls as shown FIG. 9 the now full-cylinder of assembled elements. Drive rolls 41*a* ad 41*b* assist rolls 38*a* and 38*b* and 39*a* and 39*b* in pulling the material through the assembly process. A stationary mandrel 40 maintains the internal alignment of the elements as they are driven through rolls 41*a* and 41*b*. The outside diameter of mandrel 40 is slightly less than the inside diameter of the assembled tube 20 so as to guide but not bind the elements as they pass through rolls 41*a* and 41*b*.

The full cylinder 20 emerging from rolls 41*a* and 41*b* now enters a banding means device 42 where bands 21 are tightly seized upon the tube 20 of assembled elements at intervals, thus pressing the uncoated flange of each zee against the adjacent "N" element and forming a series of alternate "hot" and "cold" junctions of a thermopile which lie elementally and longitudinally the entire length of the tube, with all of the "cold" junctions lying at or near the external periphery of the tube and all of "hot" junctions lying at or near the internal periphery of the tube. If the banding material is electrically conductive, there is bonded to the internal periphery of bands 21 a coating 22 (shown FIGS. 1, 2, 3 and 4) of electrical insulating material of good strength in compression.

The bander 42 travels during the banding operation in the same direction as the assembled tubing 20 and at the same speed the tubing 20 emerges from the drive rolls 41*a* and 41*b*. Upon completion of the banding operation 42 is disengaged from the tubing 20 and travels back toward rolls 41*a* and 41*b* to repeat the banding operation. In one type of bander, one each of two half-cylinders of the coated band 21 are automatically fed to electrodes in the bander 42 which clamp these half-bands tightly on the tube, then butt-weld them together. A cooling means quenches the welds before the clamping pressure is released so that the band shrinks and seizes upon the assembly of wedge-shaped thermoelectric elements, banding them at intervals with considerable force into a continuous tubular thermopile of circular cross-section.

Although not shown on the drawings, item 42 of FIG. 5 may be a wrapping means wherein a tape of good tensile strength and ductility, either solid or perforated, may be helically wrapped continuously and tightly on the external surface of the tubular thermopile. If the tape is electrically conductive it has s coating of insulation similar to coating 22 of FIGS. 1, 2, 3 and 4 on the face contacting the tube. Wrapping material is heated by a heating means prior to application so that when cooled it shrinks on the tubing. Means to secure the ends of the wrapping are provided at the point of cut-off of the tube.

It should be noted that the assembly of certain types of thermoelectric materials may be effected by pulling all of the strips of material through a stationary tapered die containing a plurality of converging guide slots arrayed so as to converge the entire plurality of strips to a full cylinder in one step and discharge them over the stationary mandrel described above which in this case is an integral core of the die. The mating drive rolls may then be placed at the point of discharge over the mandrel or even downstream of the banding or wrapping operation in which case their peripheries are shaped to accommodate the banded or wrapped thermoelectric tubing. The intermediate step of forming half-cylinders and the associated half-cylinder drive and forming rolls are thus eliminated when materials will permit assembly by this simplified method.

A travelling cut-off saw means 43 travels at the same speed and in the same direction the tubing emerges from the bander 42 during the cut-off operation. Upon completion of the cut, 43 disengages and returns toward 42 and into position for the next cut. Saw 43 may be programmed to cut the thermoelectric tubing to any desired length.

The speeds of drive rolls 38*a*, 39*a*, 38*b*, 39*b*, drive rolls 41*a*, 41*b*, bander or wrapper 42, and cut-off saw 43 are synchronized by a synchronizing means such as gearing or chain and sprocket connections.

Various additional operations may be performed conveniently and continuously at points in the process such as shown schematically at points 44*a* and 44*b* on FIG. 5 where the pluralities of elements may be passed through heating or cooling chambers to remove volatile constituents in bonding materials, set the coating, anneal the elements, and the like. Also, between the bander 42 and cut-off saw 43 the tubing may be given various external coatings such as the coating 23 shown between the bands 21 on FIG. 2. Coating is made of an electrical insulating material with good heat conductive properties such as "teflon" and is required if the outside of the tube is to be contacted by a coolant which is electrically conductive or is corrosive or damaging to the elements 15 and 12.

Internal coatings, if desired, may be applied continuously through appropriate conduits and applicators inserted through the stationary alignment mandrel 40. Also, if desired, the tubing may be continuously internally ground or honed or otherwise finished by an appropriate tool means inserted through mandrel 40 and working "downstream" from mandrel 40.

Certain types of thermoelectric elements will permit raising the temperature of the tubing in an oven 45 shown schematically FIG. 5 sufficiently to fuse the electrical junctions between the flanges of the "P" elements 12 and the adjacent "N" elements 15. Alternately, a set of two rolling electrodes (not shown) may be set against terminal strips 17*a* and 17*b* downstream 41*a* and 41*b* and a welding current passed through the assembly to weld these electrical junctions continuously prior to the banding or wrapping operation 42.

On FIG. 2 there is shown a typical piece of the thermoelectric tubing 20 of this invention surrounded by a coolant generally designated 50 which cools the outer periphery of the tubing and thus all of the cold junctions of the plurality of thermoelectric elements 12 and 15 which lie near the outside periphery of the tube. The coolant may be fluids, including fluids under considerable pressure in which case the fluid pressure assists the Since the power output capability of a thermopile is inherently proportionate to the area of hot junctions displayed to a given temperature heat source, then the power output capability of the thermopile of this invention may be increased by simply cutting the tubular pile to greater length. The electrical resistance decreases as the length of tube increases; accordingly, the Joule ($I^2R$) loss may be held to acceptable values in a wide range of applications without complicated rearrangement, redesign or interconnection of elements.

Since both the "hot" and "cold" electrical junctions of the thermoelectric elements extend the entire length of the tubular structure and are locked together in good electrical contact without intervening bonding materials, electrical separations of junctions are unlikely and those which might occur are localized and partial and do not completely interrupt the electrical series. Expansion of the tube wall material from application of heat results in forcing the thermopile junctions into even tighter contact than when the device is cool.

The banding material which locks the plurality of wedge-shaped elements in full-circular arch is exposed only to the fluid which cools the cold junctions in normal applications, thus the bands always remain at or near the temperature of the cooling fluid and maintain their initial physical properties.

There is no barrier of electrical insulation between the heat source and the hot junctions of the thermopile, thus there is always a high rate of heat transfer to maintain high temperature of these junctions.

Since only the materials with good high temperature properties are exposed to the heat source, a high temperature heat source may be used to achieve maximum voltage generation.

Ease and convenience of application of this invention are readily suggested. For example, a length or plurality of lengths of this tubular thermopile may be conveniently inserted in the exhaust system of an internal combustion engine or other waste heat fluid conduit to produce electric power. These tubes may be conveniently and simply arranged to be heated internally by direct oil, gas, or other fossil fuel firing, movable heated solids, or a nuclear heat source and conveniently cooled externally by fluids or radiation, to produce electric power for marine, military, or other remote location use, to supply excitation to alternators in cold electric generating plants, and the like. Under certain conditions these tubular thermopiles may be used as electricity-producing tubing in steam generators.

Two suitable lengths of this tubing or two pluralities of lengths of it may be electrically connected with one being heated internally and cooled externally, thus generating power which is then, in turn, supplied to the second tube or plurality of tubes so that a fluid or other material may be passed through the second and cooled.

The thermoelectric tubing of this invention can be rapidly mass-produced by the assembly process of this invention and, therefore, its assembled cost is relatively low.

Although several structures and embodiments of the present invention have been described and illustrated herein, it should be understood that numerous other modifications and embodiments can be devised by those skilled in the art and will fall within the spirit and scope of the principles of this invention.

What is claimed as new and desired to be secured by Letters Patent of the United States is:

1. A tubular thermopile wherein a plurality of elements comprising a series of alternate dissimilar type conductivity thermoelectric material strips and insulation of wedge-shaped cross-section are disposed as longitudinal elements of a cylinder and form the wall of said tubular thermopile, said elements being locked in full circular arch externally only by bands under stress which circumferentially seize said tubular thermopile and lock it into a full circular arch having no internal structural support, and wherein each of said strips of one type conductivity thermoelectric material is Zee-shaped in cross-section resembling a structural Zee with flanges shortened to protrude from its web approximately its web thickness and is covered with a layer of electrical insulation on both sides of the web of the Zee to the thickness the flanges protrude from the web, but not covered on the bases and toes of the flanges, the insulated Zee being wedge-shaped in cross-section with said wedge shape tapered to diverge radially outwardly of the centerline of said tubular thermopile with the planes of its sides and the vertical axis of the Zee lying radial to the centerline of the tube, and wherein each of said strips of one type conductivity thermoelectric material lies adjacent to a strip of opposite type conductivity material, and wherein each of said strips of opposite type conductivity thermoelectric material is wedge-shaped in cross-section being also tapered so as to diverge radially outwardly of the centerline of the tubular thermopile with the planes of its sides lying radial to said centerline, each of said strips of one type thermoelectric material except the first of said series having the uninsulated toe of the flange of its Zee at the outside periphery and continuously along the length of said tubular thermopile pressed therealong against the next circumferentially preceding of said opposite type thermoelectric material strips of said series and forming an electrical junction, the plane of said junction lying radial to the centerline of the tube, and each of said strips of said one type thermoelectric material, except the last of said series, having the uninsulated toe of the flange of its Zee at the inside periphery and continuously along the length of said tubular thermopile pressed therealong against the next circumferentially following of said opposite type thermoelectric strips of said series and forming an electrical junction, the plane of said junction lying radial to the centerline of the tube, thereby junctioning all of both types except the first and last of said series of said elements in electrical series with means incorporated in said full circular arch to separate electrically the first and last elements of said electrical series, said series of elements and separating means forming the wall of the tubular thermopile with all of the first-mentioned junctions adjacent to the outside periphery and all of the second-mentioned junctions adjacent to the inside periphery of the tubular thermopile.

2. The tubular thermopile of claim 1 in which the means to separate electrically the first and last of the series of thermoelectric elements is a strip of electrical insulation wedge-shaped in cross-section placed between two strips of metal having good electrical conductivity also wedge-shaped in cross-section which contact the ends of the thermoelectric series and serve as electrical terminals for it, these three strips being similar geometrically to the insulated and uninsulated thermoelectric strips of claim 1 and placed similarly in and being a structural part of the full circular arch of claim 1.

3. The tubular thermopile of claim 1 in which the bands under stress of claim 1 are made of good tensile strength metal and have a layer of electrical insulation on at least the inside periphery of said bands.

4. The tubular thermopile of claim 1 in which the edges of the strips of thermoelectric materials facing the centerline of the tube, but not the edges of the electrical insulation layers on the thermoelectric strips facing the centerline of the tube, have a coating of metal suitable for high temperature service and of good heat conductance.

5. The tubular thermopile of claim 1 in which the outside periphery of the wall of said tubular thermopile has a coating of electrical insulation of good heat conductance on at least the areas of said periphery not covered by the bands under stress of claim 1.

6. The tubular thermopile of claim 1 in which the thermoelectric material portions of the strips of one type thermoelectric material of Zee-shaped cross-section are formed by folding a portion of a flat strip of said material at one edge and continuously therealong over 180° clockwise against one side of said strip and folding a portion of the flat strip of said material at the other edge and continuously therealong over 180° counterclockwise against the other side of said strip to effect said Zee-shape cross-section.

7. The tubular thermopile of claim 1 in which the electrical insulation coverings on a plurality of the thermoelectric material strips have embedded in them at least one electrically conductive wire lying longitudinally the tubular thermopile and parallel the said strips, said plurality of wires then being connected sequentially in a continuous electrical series, one to another at alternate ends of the tubular thermopile by electrical conductor means and have an electrical connector means at the ends of said series to pass an electric current from a varying-voltage direct current or alternating current electric power source means through said electrical series of wires to induce an electric current in the elements of the thermopile and thereby modify the amount and characteristics of the electric power produced by said tubular thermopile.

8. A plurality of the tubular thermopiles of claim 1 with one end of each tubular thermopile of the plurality secured in a hole in a tube sheet containing a corresponding plurality of holes and the other end of each tubular thermopile secured in a hole in a second tube sheet containing also a corresponding plurality of holes, such that the inside peripheries of the walls of all the plurality of tubular thermopiles communicate to a common heating fluid or other heating medium means and the outside peripheries of the plurality of tubular thermopiles communicate to a common cooling fluid or other cooling medium means.

9. At least one tubular thermopile of claim 2 connected electrically at the terminal strips by conductor means to the terminal strips of at least one other tubular thermopile and with the first-mentioned thermopile being heated on one side of its wall by a heating means and cooled on the other side of its wall by a cooling means and producing electric power by the Seebeck effect and delivering said electric power to the second-mentioned thermopile which then cools a fluid contacting one side of said second-mentioned thermopile wall, said second-mentioned thermopile wall being cooled by the Peltier effect.

* * * * *